United States Patent [19]

Dhong et al.

[11] Patent Number: 5,541,887
[45] Date of Patent: Jul. 30, 1996

[54] MULTIPLE PORT CELLS WITH IMPROVED TESTABILITY

[75] Inventors: Sang H. Dhong, Mahopac; Wei Hwang, Armonk; Toshiaki Kirihata, Wappingers Falls, all of N.Y.

[73] Assignee: International Business Machines Corporation, Armonk, N.Y.

[21] Appl. No.: 375,025

[22] Filed: Jan. 19, 1995

[51] Int. Cl.$^6$ ............................................. G11C 7/00
[52] U.S. Cl. ........................... 365/230.05; 365/230.06; 365/230.08; 365/239; 365/194
[58] Field of Search ........................ 365/230.01, 230.05, 365/230.03, 189.03, 230.06, 230.08, 239, 194

[56] References Cited

U.S. PATENT DOCUMENTS 5,434,818  7/1995  Byers et al. .................. 365/189.05

Primary Examiner—Viet Q. Nguyen
Attorney, Agent, or Firm—Whitham, Curtis, Whitham & McGinn; Robert P. Tassinari

[57] ABSTRACT

Sequentially terminated write enable pulses applied to respective input ports of a multi-port memory cell is effective to establish a priority among those input ports and provide unconditionally unambiguous writing to a memory cell when write operations are concurrently attempted at two or more ports of that cell, as may be encountered during rigorous testing procedures. Memory structure, particularly that of the input port circuits, is simplified and operational speed is enhanced since signal propagation through a comparator or logic circuit is avoided. Time required for testing of large memory arrays is also significantly reduced.

16 Claims, 6 Drawing Sheets

MULTIPLE PORT CELLS WITH IMPROVED TESTABILITY

BACKGROUND OF THE INVENTION

1. Field of the Invention

The present invention generally relates to electronic memories and, more particularly, to enhancing performance and testability of electronic memories used in data processing equipment.

2. Description of the Prior Art

The operation of many microprocessor controlled devices and data processors in general relies, at a most basic level, relies on the ability of the processor to retrieve data or instructions from memory, perform an operation on such data or in accordance with such instruction and to store a resulting digital signal in memory, a register or other digital signal storage structure with an extremely high degree of reliability. For this reason, many error checking architectures and techniques have been developed and incorporated into processors or associated hardware or software in order to increase the reliability with which the processor functions. It is equally important that the storage structure respond reliably and unambiguously when digital signals are applied to it and various testing procedures have been developed to ensure reliable operation thereof, particularly in combination with data processors.

Some high performance processor architectures have adopted multiple-port storage structures in order to enhance performance of certain operations. A look-aside buffer used in some cache applications is a familiar example of an application where multiple memory input ports provides a performance enhancement. In such multiple-port storage devices, simultaneous write operations which could involve attempts to store inconsistent digital signals are not allowed. However, for purposes of testing of the multiple-port storage devices one recent and rigorous testing procedure requires that an unambiguous signal storage state must be achieved even when simultaneous write operations are attempted at different ports.

The reason for such a test criteria is that stored data must not be corrupted by the possibility of an ambiguous response if simultaneous write operations were to occur. That is, one set of digital data signals applied to the storage device must be correctly stored to avoid errors which are not recoverable. If a different set of digital data signals must be stored in a subsequent processor cycle to correctly accomplish an operation, such storage can be readily accomplished while corrupted data signals may cause other errors to be propagated through the system.

In the past, it has been the conventional practice to provide logic circuitry between inputs at various ports of a multiple-port storage device to provide a priority between input ports. Such logic circuitry, at a minimum, determines the simultaneous presence of a signal at two or more ports to generate appropriate enable signals in order to prevent simultaneous application of the signals to a memory cell. This selective port enablement function is conventionally accomplished using a comparator. However, regardless of the nature of the circuit, logic signals must be propagated through it before a write operation can be attempted, resulting in reduced speed of operation. Further, comparators must generally be merged with write decoders which complicates circuit design and fabrication and may further slow the performance of all write operations. Such reduced speed of performance is particularly undesirable where the memory or storage device is arranged to perform plural memory operations in a single cycle, such as in a so-called write-before-read mode of operation. These problems are aggravated by increases in logic circuit or comparator complexity as the number of ports is increased.

SUMMARY OF THE INVENTION

It is therefore an object of the present invention to provide an arrangement for establishing a priority between ports of a multiple-port storage device which does not degrade performance of a write operation.

It is another object of the invention to provide a multiple-port digital storage cell structure which will provide an unambiguous response to attempted simultaneous write operations at different ports.

It is a further object of the invention to provide an arrangement achieving unambiguous performance of a memory cell without speed degradation or increase of circuit complexity as the number of ports is increased and which accommodates all combinations of ports to which signals may be simultaneously applied for storage.

In order to accomplish these and other objects of the invention, a method of unambiguously writing to a multi-port memory cell is provided comprising the steps of applying write enable signals to a plurality of input ports of the memory cell, and sequentially terminating the write enable signals.

In accordance with another aspect of the invention, a memory including multi-port memory cell is provided wherein a plurality of input ports each comprise a logic arrangement for receiving a decoded port address signal and a write enable signal, each respective write enable signal being sequentially terminated.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
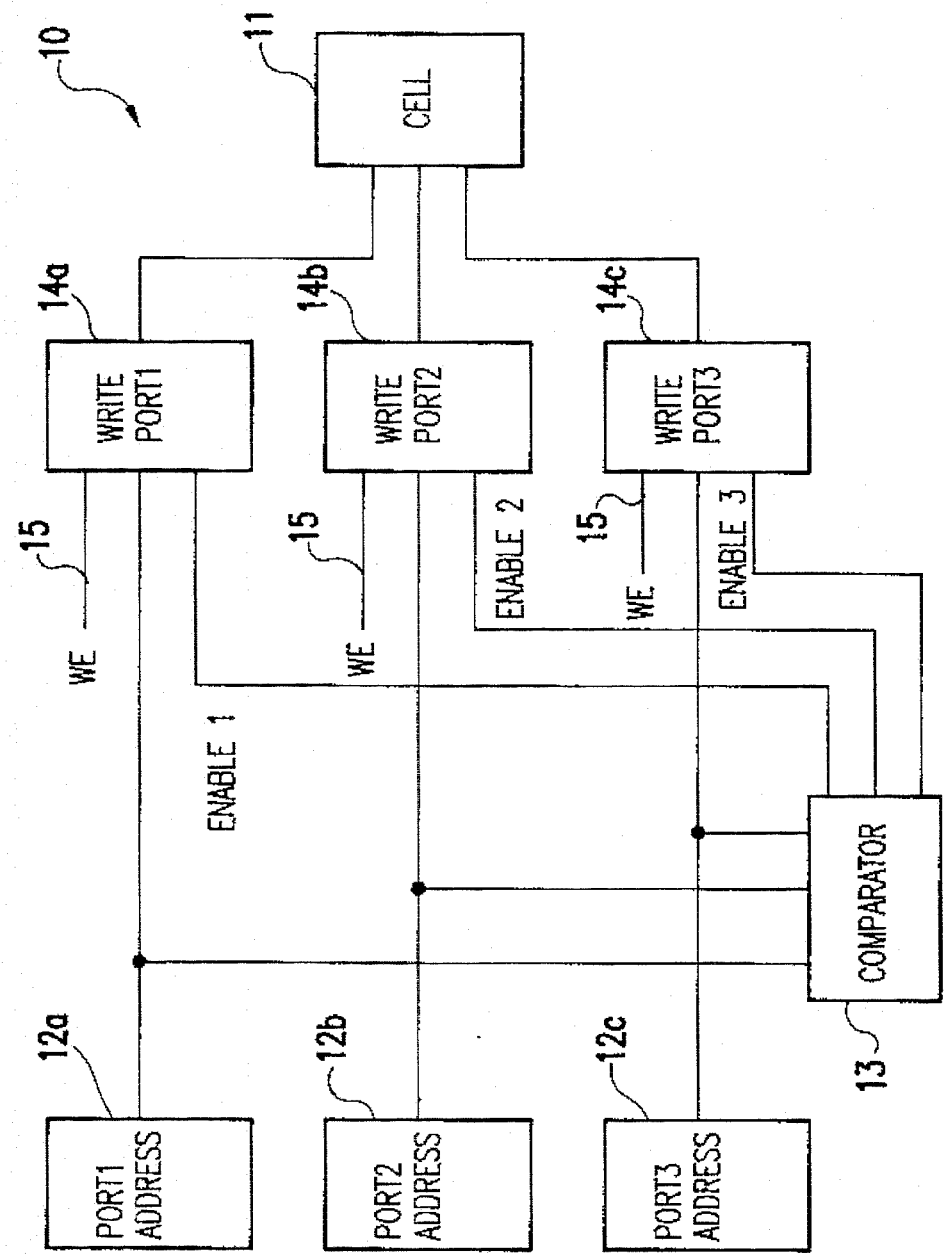
FIG. 1 is a block diagram of a conventional three-port memory cell.

Referring now to the drawings, and more particularly to FIG. 1, there is shown a conventional arrangement 10 for preventing simultaneous writes to a memory cell 11. Memory cell 11 is illustrated as having three input ports as is generally sufficient for most applications in processor architectures although more such input ports can be provided, if desired. Address decoders 12a, 12b and 12c detect addresses specific to each of the input ports of the cell. Comparator 13 is responsive to the outputs of all three port address decoders and provides three mutually exclusive enable outputs based on the identity and number of outputs detected from the address decoders. A write enable signal WE is simultaneously applied to all write ports 14a, 14b and 14c and selection between the write ports is thus a function of the comparator output; the output of one or more address decoders thus being effectively disabled if two or more such address decoder outputs are simultaneously present.

The particular logic by which the mutual exclusivity of outputs is achieved is not important to an understanding of the present invention except to the extent that it must be recognized that propagation of a signal through several logic stages is necessary in this exemplary conventional arrangement to enable one of the write ports 14a, 14b or 14c, even when only one address decoder provides an output. Therefore, the use of a comparator or other logic circuit slows the operation of writing to a memory cell 11 for all write operations even when only a single port is enabled, as would ordinarily be the case. Accordingly, it is seen that suppressing the relatively rare occurrence of an attempt to simultaneously write to cell 11 through more than one port requires the slowing of all write operations.

Figure 2:
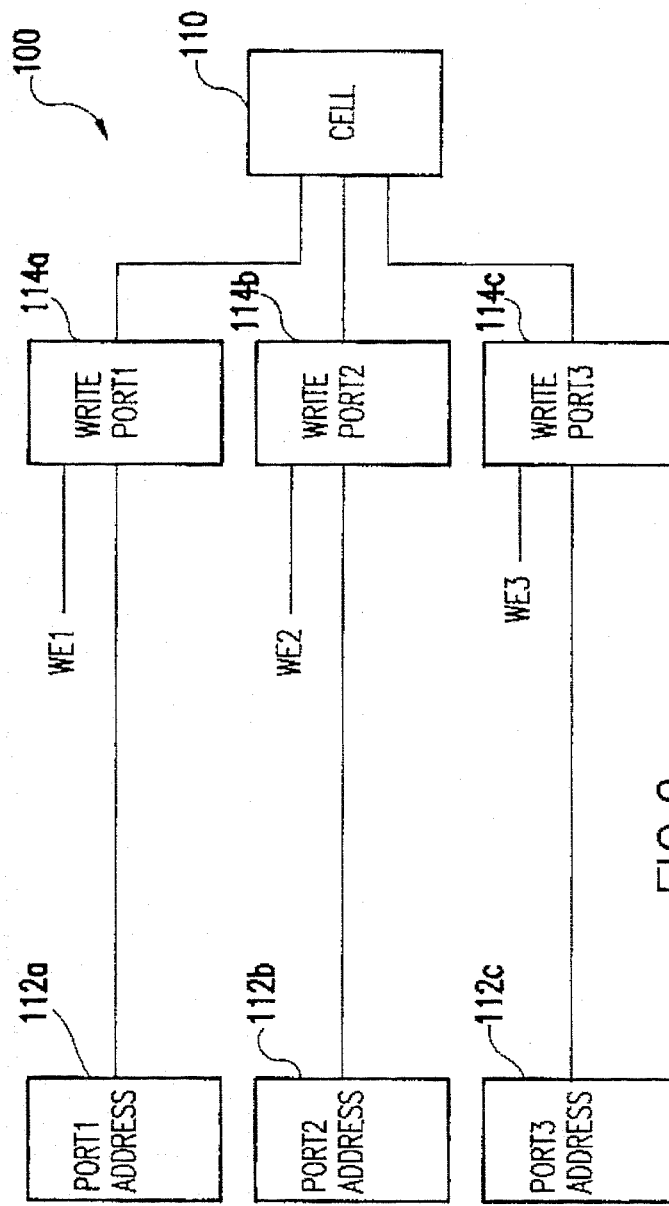
FIG. 2 is a block diagram of a three-port memory cell in accordance with the invention.

In accordance with the invention, shown in block diagram form in FIG. 2, port decoders 112a, 112b and 112c are provided as in the conventional circuit but comparator or logic circuit 13 is omitted altogether. The logic of the write ports 114a, 114b and 114c is simplified to have only two inputs each. Therefore, a simple AND gate or transmission gate having a short propagation time of signals therethrough is suitable for control of each of the three (or more) ports of memory cell 110.

Figure 3:
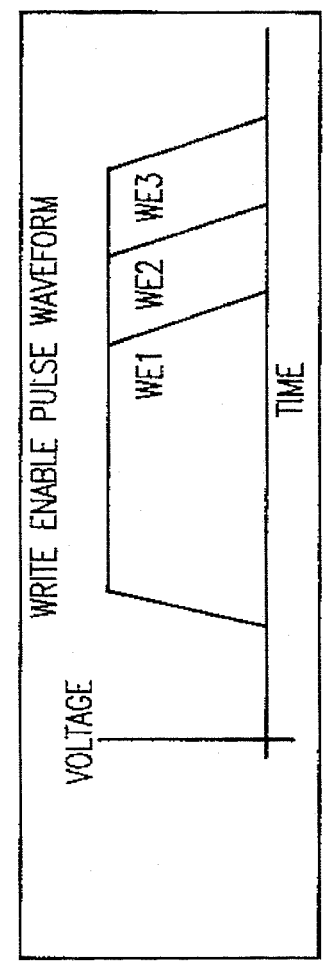
FIG. 3 illustrates input waveforms to the arrangement of FIG. 2.

This simplification of the write port structures 114a, 114b and 114c is a direct result of the write pulse enable waveform which, in contrast with the arrangement of FIG. 1, is not common to all ports. Specifically, while the leading edges of respective write enable pulses WE1, WE2 and WE3 are coincident in time in accordance with a first embodiment of the invention and are concurrently applied for a short period, as shown in FIG. 3, the trailing edges of the respective pulses are staggered in time. Thus, if a simultaneous write operation is attempted at two or more ports, an indeterminate state is initially assumed by cell 110 during the period write enable signals are concurrently applied but the indeterminate state is resolved by the staggered trailing edges of the respective write enable pulses.

That is, the cell will always store the data from the port at which the write enable pulse is last terminated among those ports from which simultaneous writing is attempted. Therefore, if simultaneous writes are attempted from ports 1 and 2, the input from port 2 will be stored. Likewise, if simultaneous writes are attempted from ports 1 (and/or port 2) and 3, the input from port 3 will be stored. Thus, a priority is established between ports and one port will always unambiguously store to cell 110. Of course, if only a single port is active, the write operation will be performed through that port without the necessity of exclusively enabling that port by propagation of signals through a comparator or the like.

Figure 4:
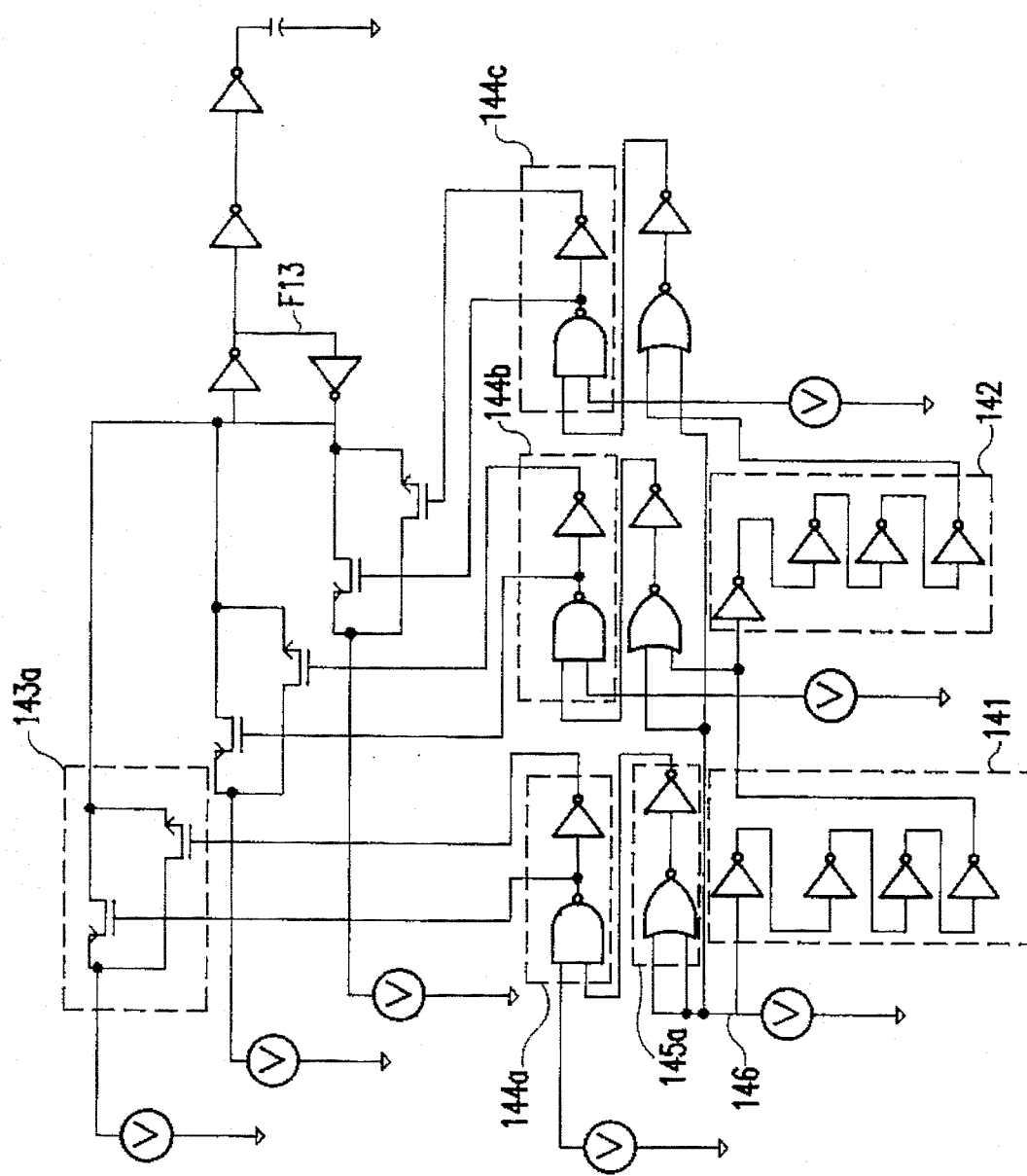
FIG. 4 is a schematic diagram of a first embodiment of the invention in which falling edges of the write enable pulses are relatively delayed.

Referring now to FIG. 4, a logic diagram of an exemplary implementation of the embodiment of the invention shown in FIG. 2 is shown. While the circuit appears complex, the transmission gates such as 143a are formed by a complementary pair of field effect transistors (FETs) with appropriate true and complement inputs provided by gates and inverter circuits such as 144a. Nor gate and inverter pairs such as 145a receive the same input 146 to establish a simultaneous leading edge for all three write enable pulses. The trailing edges of WE2 and WE3 are extended by delay in serially connected delay lines 141 and 142, respectively, which are respectively input to inputs of NOR gates of circuits 144b and 144c, respectively.

Figure 5:
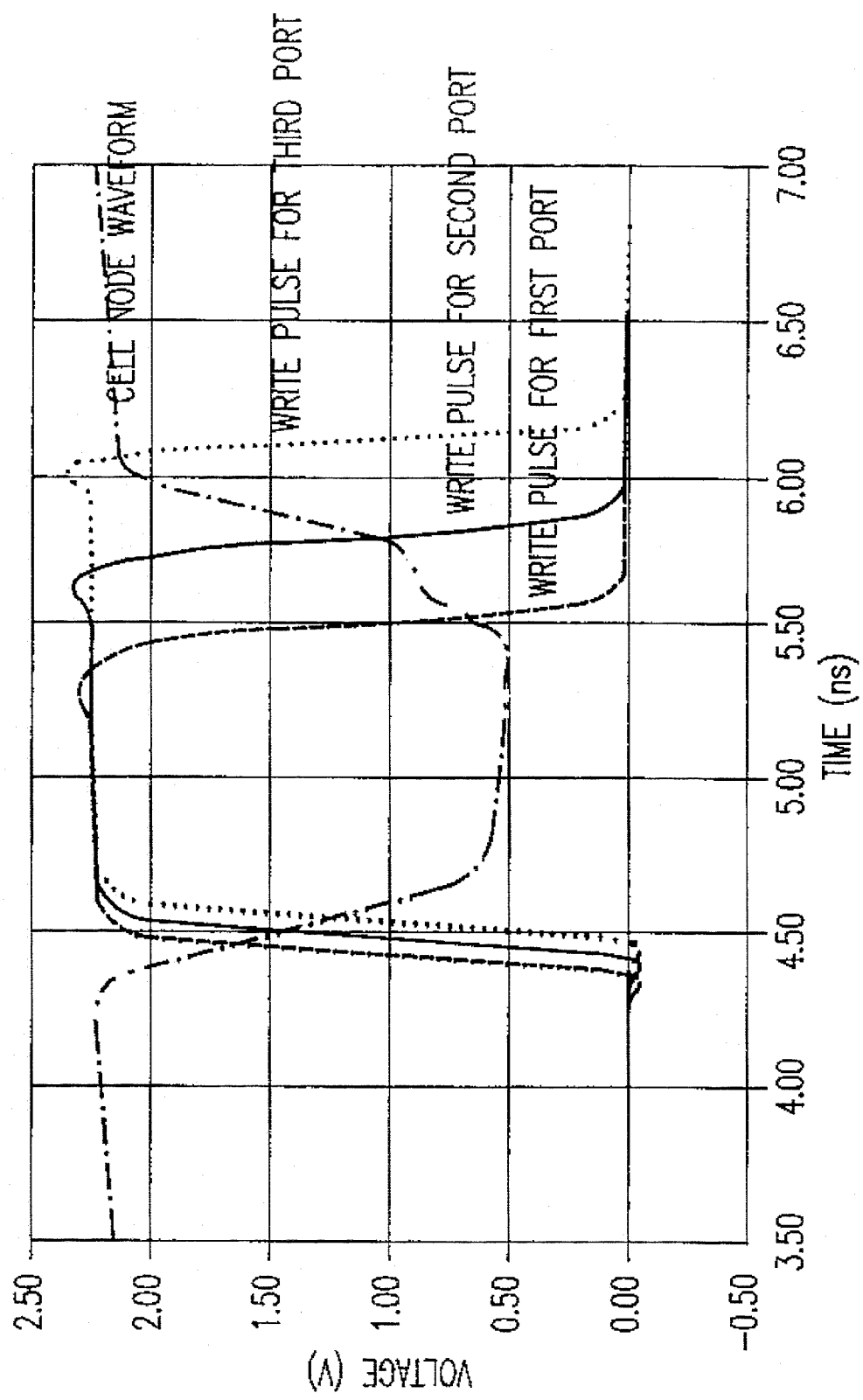
FIG. 5 illustrates waveforms reflecting simulated performance of the circuit of FIG. 4.

Simulated performance of the circuit of FIG. 4 is shown in FIG. 5. For purposes of this simulation, ports 1 and 2 have a logical "0" value voltage applied thereto while port 3 receives a logical "1". As can be seen, the leading edges of the three write enable pulses are virtually coincident in time but a relative delay is produced in the trailing edges of write enable pulses WE2 and WE3. In response to the simultaneous application of the write enable pulses, the cell 110 initially assumes an ambiguous state, as noted above. The actual voltage applied to the cell will be derived by a voltage divider-like action depending on the logical value of inputs applied to respective ports. In this regard, it should be noted that the voltage applied to cell 110 rises step-wise at the trailing edge of write enable pulse WE1 and the logical "0" applied to port 1 is disabled. Then, at the trailing edge of write enable pulse WE2, port 2 is disabled and the ambiguous state of cell 110 is resolved to correspond to the logic value applied to port 3.

Figure 6:
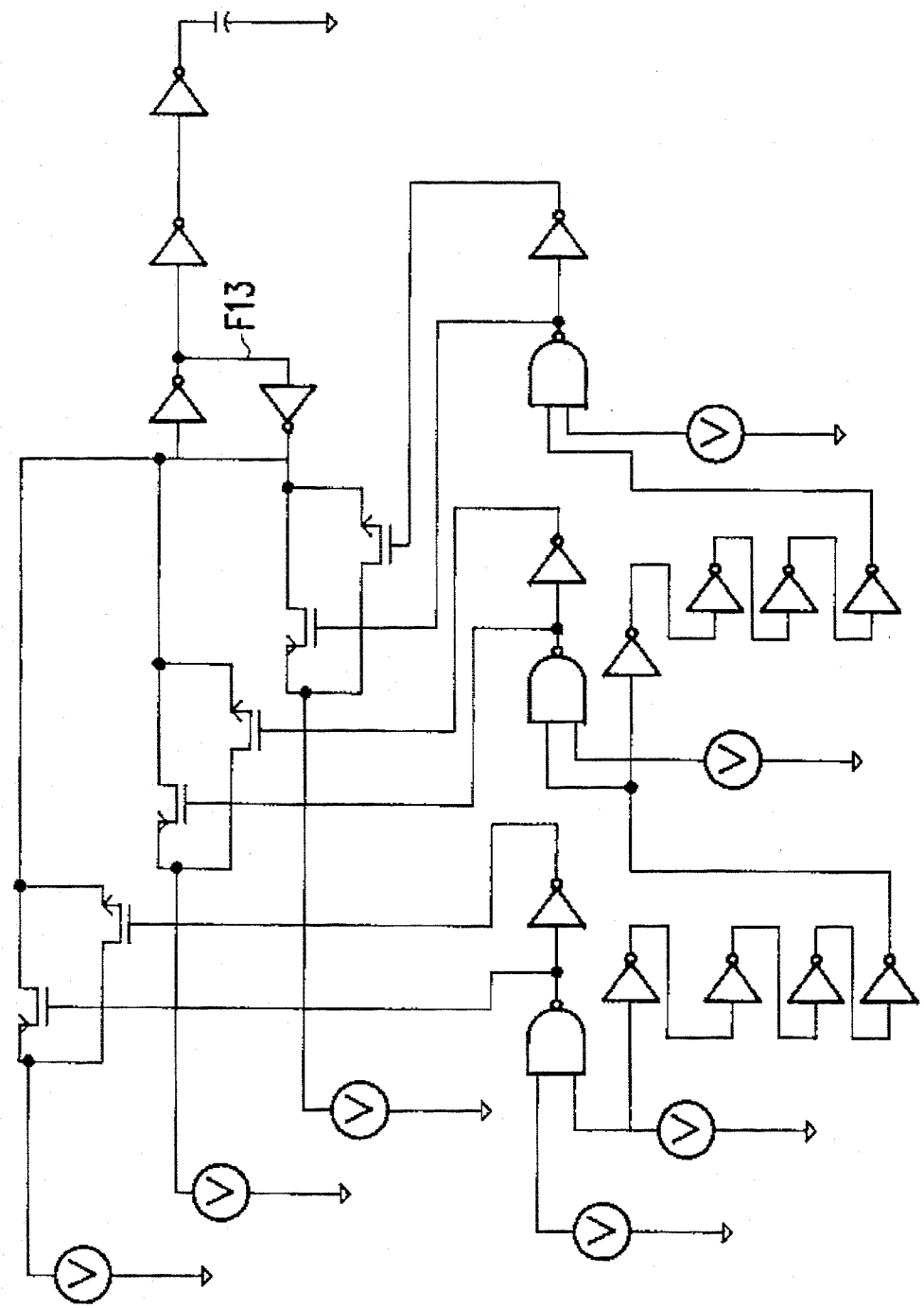
FIG. 6 is a schematic diagram of a second embodiment of the invention in which write enable pulses are sequentially delayed.

Referring now to FIG. 6, a logic diagram of an alternative embodiment of the invention is shown. This embodiment is the same as that of FIG. 4 except that the write enable pulse PWRITE is propagated through the delay line sections such that both the leading and trailing edges are sequentially shifted in time. It should be noted that, as in the embodiment of FIG. 4, it is preferable for highest speed consistent with adequate write enable pulse length that the delay is substantially shorter than the write enable pulse duration such that the write enable signal is concurrently applied to plural input ports. As is seen in FIGS. 4 and 6, feedback path FB provides fast recovery when the ambiguous state is resolved by the staggered trailing edges of the write enable pulses. Concurrent enablement also avoids the effect of possibly writing a plurality of times to the cells with the potentially attendant stressing of components and radiated noise which may result if the memory cells were to change state several times during a write, as would be the case if the write enable signals were not concurrent. Nevertheless, it must be borne in mind that it is the staggering of the trailing edges of the write enable pulses which establishes priority among the input ports and is adequate to the successful practice of the invention.

Figure 7:
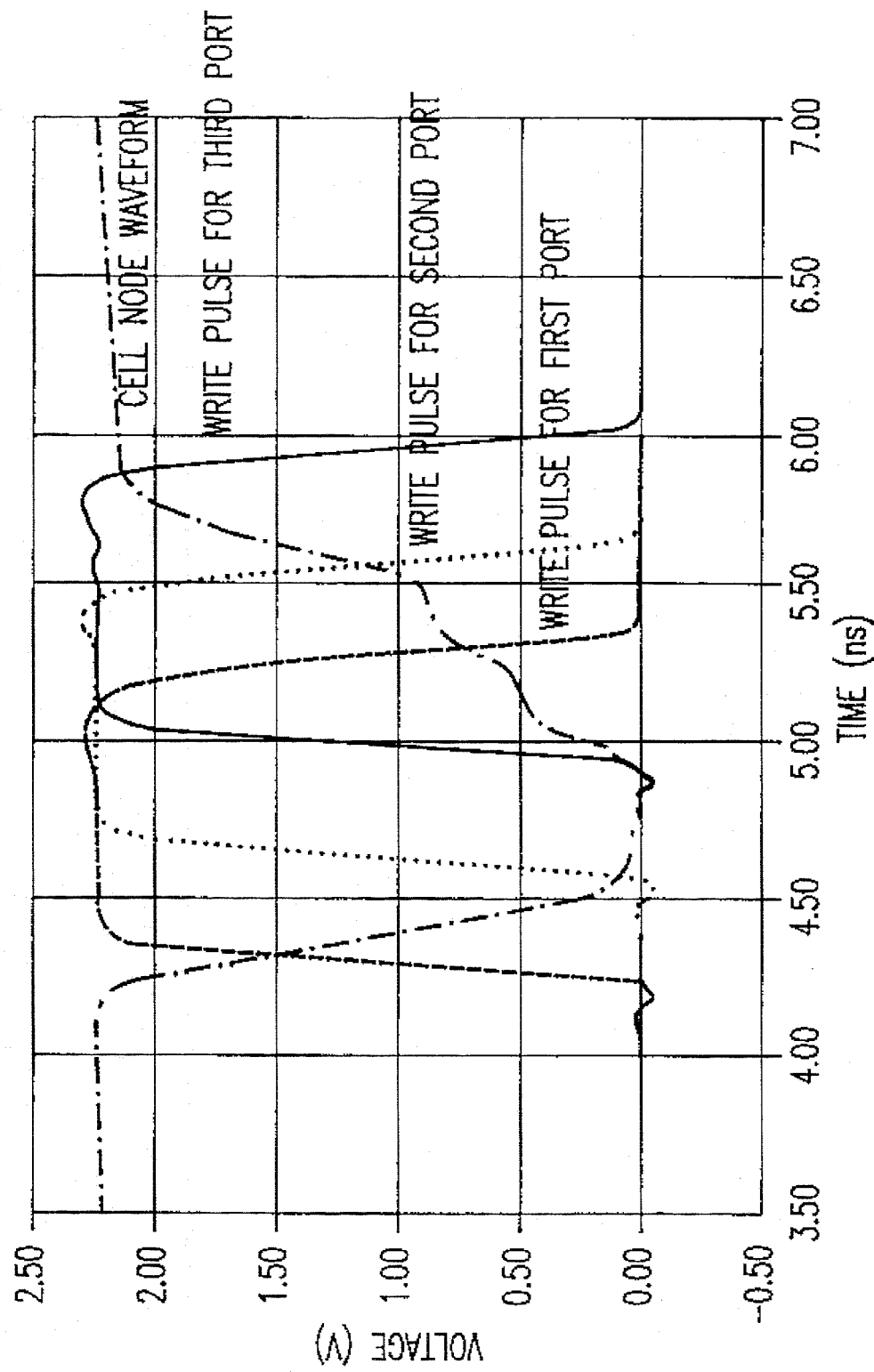
FIG. 7 illustrates waveforms reflecting simulated performance of the circuit of FIG. 6.

In simulating the performance of the embodiment of FIG. 6, it is assumed that the inputs applied to respective ports are the same as used in the simulation depicted in FIG. 5. In the simulation shown in FIG. 7, WE1 enables port 1 and the voltage applied to the cell drops to logical "0" which is not disturbed by the onset of WE2. At the onset of WE3, an ambiguous state of cell 110 occurs with a step-wise rise in the voltage applied thereto, again by voltage divider-like action of the transmission gates. Then at the trailing edge of WE1, the voltage at cell 110 undergoes another step-wise rise, as in FIG. 5 and the ambiguous state of cell 110 is resolved at the trailing edge of WE2 to the input at port 3 when only WE3 remains active.

It should be noted that, as would be inherent in the embodiment of FIG. 4, the write enable pulses should be of a duration such that all input ports will be simultaneously enabled for at least a short period of time in order to maintain a priority among all possible input combinations. This period could be shortened if some of the input ports were necessarily mutually exclusive and priority between one or more certain groups of input ports need not be provided. It follows that this period of time should at least equal the rise time of the inputs to the transmission gates times the number of ports. However, by the same token, only the rise or propagation time for a single or very small number of logical elements are involved. The corresponding period, for any particular technology, will be several times longer than the entire process shown in FIGS. 5 or 7 if multi-stage logic or comparison is used as in prior arrangements described above. Further, the present invention is not subject to timing or other logic signal errors since the sequence of trailing edges of write enable pulses is autonomously generated, either locally (as is preferred) or remotely, and a priority among all input ports and unconditionally unambiguous writing to a cell is guaranteed.

The operation of the two embodiments of the invention described above is very similar and the embodiments are substantially interchangeable. However, the duration of ambiguous states is somewhat less for some input combinations in the embodiment of FIG. 6 and power dissipation may be reduced, depending on the specific circuitry of the memory cell 110. On the other hand, in the embodiment of FIG. 6, the frequency content of all write enable pulses in the embodiment of FIG. 6 will be the same and the amount of radiated electrical noise may be somewhat greater or require some precautions to be taken (e.g against resonance with parasitic coupling to other circuits).

In view of the foregoing, it is seen that the invention provides a simplified technique and arrangement for establishing priority between input ports of a multiple-port digital signal storage cell and which avoids imposition of slow speed of execution of write operations to the cell. Further, the benefits of the invention may be particularly advantageous when it is appreciated that current rigorous testing procedures for large arrays of memory cells require attempts to simultaneously write from multiple ports to each cell even though such multiple simultaneous writes are prohibited in normal operation. Therefore, the time required for testing of an array of memory cells is cut to a small fraction of the time required for testing of conventional multiple-port cells and higher degrees of reliability and certainty of correct functioning of the memory array can be economically achieved. Additionally, the relative simplicity of the device in accordance with either embodiment of the invention and variations thereon allows substantial economies of production and manufacturing yield.

While the invention has been described in terms of a single preferred embodiment, those skilled in the art will recognize that the invention can be practiced with modification within the spirit and scope of the appended claims.

Having thus described my invention, what we claim as new and desire to secure by letters patent is as follows:

1. A method of unambiguously writing to a multi-port memory cell comprising the steps of applying write enable signals to a plurality of input ports of said memory cell, and sequentially terminating said write enable signals.

2. A method as recited in claim 1, wherein the leading edges of said write enable signals are simultaneously applied to said plurality of input ports.

3. A method as recited in claim 1, wherein a write enable signal is sequentially delayed to produce said sequential terminating of said write enable signals applied to said input ports.

4. A method as recited in claim 1, wherein said write enable signals are applied to all input ports of said memory cell.

5. A method as recited in claim 1, wherein said write enable signals are concurrently applied to said plurality of input ports.

6. A method as recited in claim 5, wherein leading edges of said write enable signals are simultaneously applied to said plurality of input ports.

7. A method as recited in claim 5, wherein a write enable signal is sequentially delayed to produce said sequential terminating of said write enable signals applied to said input ports.

8. A method as recited in claim 5, wherein said write enable signals are applied to all input ports of said memory cell.

9. A memory including multi-port memory cell wherein a plurality of input ports of said memory cell each comprise a means for receiving a decoded port address signal, and a means for receiving a write enable signal, each respective write enable signal applied to a respective one of said plurality of input ports of said memory cell being sequentially terminated.

10. A memory as recited in claim 9, wherein said memory further includes means for sequentially delaying termination of respective write enable signals.

11. A memory as recited in claim 9, wherein said memory further includes means for sequentially delaying a write enable signal to produces respective ones of said sequentially terminated write enable signals.

12. A memory as recited in claim 9, wherein said sequentially terminated write enable signals are applied to all input ports of said memory cell.

13. A memory cell as recited in claim 9, wherein said sequentially terminate write enable signals are concurrently applied to said plurality of input ports.

14. A memory as recited in claim 13, wherein said memory cell further includes means for sequentially delaying termination of respective write enable signals.

15. A memory as recited in claim 13, wherein said memory cell further includes means for sequentially delaying a write enable signal to produces respective ones of said sequentially terminated write enable signals.

16. A memory as recited in claim 13, wherein said sequentially terminated write enable signals are applied to all input ports of said memory cell.

* * * * *